(12) United States Patent
Kim et al.

(10) Patent No.: US 6,503,687 B2
(45) Date of Patent: Jan. 7, 2003

(54) ALICYCLIC PHOTOSENSITIVE POLYMER, RESIST COMPOSITION CONTAINING THE SAME AND METHOD OF PREPARING THE RESIST COMPOSITION

(75) Inventors: Hyun-woo Kim, Sungnam (KR); Si-hyueng Lee, Suwon (KR); Ki-young Kwon, Seoul (KR); Dong-won Jung, Yongin (KR); Sang-jun Choi, Seoul (KR); Sang-gyun Woo, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 31 days.

(21) Appl. No.: 09/731,896

(22) Filed: Dec. 8, 2000

(65) Prior Publication Data
US 2001/0038968 A1 Nov. 8, 2001

(30) Foreign Application Priority Data
Dec. 8, 1999 (KR) .......................................... 99-55836

(51) Int. Cl.⁷ ............................................. G03F 7/004
(52) U.S. Cl. .................................... 430/270.1; 526/282
(58) Field of Search ........................ 430/270.1; 526/282

(56) References Cited

U.S. PATENT DOCUMENTS

| | | | | |
|---|---|---|---|---|
| 6,147,249 A | * | 11/2000 | Watanabe et al. | 560/120 |
| 6,159,655 A | * | 12/2000 | Sato | 430/270.1 |
| 6,180,316 B1 | * | 1/2001 | Kajita et al. | 430/270.1 |
| 6,207,342 B1 | * | 3/2001 | Takechi et al. | 430/270.1 |
| 6,225,476 B1 | * | 5/2001 | Hada et al. | 549/323 |
| 6,251,560 B1 | * | 6/2001 | Wallow et al. | 430/270.1 |
| 6,284,429 B1 | * | 9/2001 | Kinsho et al. | 430/270.1 |
| 6,303,265 B1 | * | 10/2001 | Sato | 430/270.1 |
| 6,348,296 B1 | * | 2/2002 | Jung et al. | 430/270.1 |
| 2002/0009666 A1 | * | 1/2002 | Sato et al. | 430/270.1 |
| 2002/0009667 A1 | * | 1/2002 | Nishimura et al. | 430/270.1 |
| 2002/0013448 A1 | * | 1/2002 | Barclay et al. | 528/271 |

FOREIGN PATENT DOCUMENTS

EP 001128212a2 * 2/2001 ........... G03F/7/004

OTHER PUBLICATIONS

Joice P. Mathew, et al.; Macromolecules, 1996, 29, pp. 2755–2763, American Chemical Society.

* cited by examiner

Primary Examiner—Janet Baxter
Assistant Examiner—Yvette M. Clarke
(74) Attorney, Agent, or Firm—Lee & Sterba, P.C.

(57) ABSTRACT

A photosensitive polymer having a main chain consisting of only norbornene-type alicyclic units, a resist composition containing the photosensitive polymer and a preparation method thereof, wherein the photosensitive polymer is represented by the following formula:

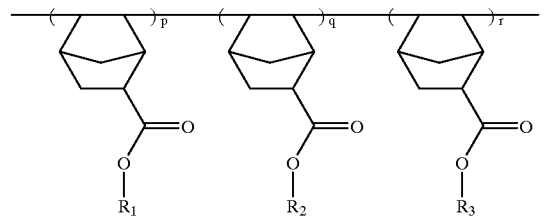

wherein $R_1$ is an acid-labile tertiary alkyl group, $R_2$ is γ-butyrolactone-2-yl, γ-butyrolactone-3-yl, pantolactone-2-yl, mevalonic lactone, 3-tetrahydrofuranyl, 2,3-propylenecarbonate-1-yl or 3-methyl-γ-butyrolactone-3-yl, $R_3$ is a hydrogen atom, methyl, ethyl or $C_3$ to $C_{20}$ alicyclic hydrocarbon, and $p/(p+q+r)$ is 0.1~0.8, $q/(p+q+r)$ is 0.2~0.8, and $r/(p+q+r)$ is 0.0~0.4. To prepare the photosensitive polymer, at least two different norbornene-type compounds having an ester group as a substituent are reacted in the presence of an initiator at a temperature of about 120 to about 150 ° C. without a reaction catalyst.

25 Claims, No Drawings

ALICYCLIC PHOTOSENSITIVE POLYMER, RESIST COMPOSITION CONTAINING THE SAME AND METHOD OF PREPARING THE RESIST COMPOSITION

BACKGROUND OF THE INVENTION

1. Field of the Invention

The present invention relates to a photosensitive polymer and a chemically amplified resist composition containing the same, and more particularly, to a photosensitive polymer having a main chain consisting of only norbornene-type alicyclic units, a resist composition containing the same, and a method of preparing the resist composition.

2. Description of the Related Art

As semiconductor devices become highly integrated, fine pattern formation is required in a photolithography process. Further, as the capacity of a semiconductor device increases to exceed 1 giga bit, a pattern size having a design rule of less than 0.2 $\mu$m is required. Accordingly, there are limitations in using a conventional resist material with a KrF excimer laser (248 nm). Thus, new resist materials capable of being developed using an ArF excimer laser (193 nm) have been developed for a lithography process.

The resist materials used in the lithography process using the ArF excimer laser have several problems in being commercially used, compared to the conventional resist materials. The most typical problems are transmittance of a polymer and resistance to dry etching.

As the widely known ArF resist materials, (meth)acrylate polymers are generally used. In particular, the most typical resist material is a poly(methyl methacrylate-tert-butyl methacrylate-methacrylic acid) terpolymer system manufactured by IBM, Inc. However, such polymers have very weak resistance to dry etching.

Accordingly, to increase the resistance to dry etching, a polymer having a backbone composed of an alicyclic compound such as an isobornyl group, an adamantyl group or a tricyclodecyl group, is used. However, the resulting resist still exhibits weak resistance to dry etching.

Alternatively, in order to increase the resistance to dry etching, norbornene-type polymers having a main chain consisting of alicyclic units are used. The norbornene-type polymers are known to be incapable of radical polymerization by themselves. In this context, the norbornene-type polymers are prepared by alternating copolymerization with maleic anhydride. However, due to the introduction of maleic anhydride, the resistance to dry etching is lowered and the stability over time is poor, which shortens the shelf life of the polymer.

Accordingly, attempts have been made to attain copolymers having a main chain consisting of only norbornene-type units using addition polymerization employing a metallic catalyst such as palladium (see Joice P. Mathew et al., Macromolecules, 1996, 29(8), p 2755.). However, it is difficult to completely remove the metallic catalyst used for polymerization. Thus, in the case of using a resist composition obtained from the polymer, metallic components may remain on a wafer, which becomes a drawback in the use of the resist composition in manufacturing an electronic apparatus such as a semiconductor device.

SUMMARY OF THE INVENTION

To solve the above problems; it is a feature of a preferred embodiment of the present invention to provide a photosensitive polymer having a main chain consisting of only norbornene-type units so that sufficient resistance to dry etching can be attained.

It is another feature of a preferred embodiment of the present invention to provide a resist composition which contains the photosensitive polymer, which is free from a possibility that metallic components remain on a wafer, and which provides for excellent lithographic performance during a lithography process using an ArF excimer laser.

It is still another feature of a preferred embodiment of the present invention to provide a method of preparing a photosensitive polymer capable of synthesizing a polymer having a main chain consisting of only norbornene-type units without using a metal catalyst.

Accordingly, to achieve the above features, there is provided a photosensitive polymer represented by the following formula (1):

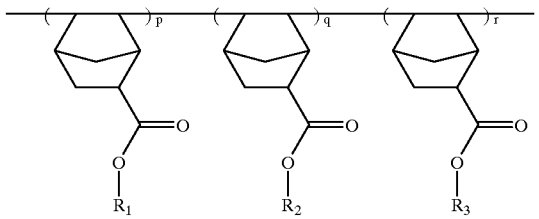

wherein $R_1$ is an acid-labile tertiary alkyl group, $R_2$ is -butyrolactone-2-yl, $\gamma$-butyrolactone-3-yl, pantolactone-2-yl, mevalonic lactone, 3-tetrahydrofuranyl, 2,3-propylenecarbonate-1-yl or 3-methyl-$\gamma$-butyrolactone-3-yl, $R_3$ is a hydrogen atom, methyl, ethyl or $C_3$ to $C_{20}$ alicyclic hydrocarbon group, and $p/(p+q+r)$ is about 0.1 to about 0.8 (0.1~0.8), $q/(p+q+r)$ is 0.2~0.8, and $r/(p+q+r)$ is 0.0–0.4.

Preferably, the photosensitive polymer has a weight-average molecular weight of 3,000~100,000.

$R_1$ is preferably t-butyl, 2-methyl-2-adamantyl, 1,2,3,3-tetramethyl-2-norbornyl, 2-methyl-2-decanyl, 2,3,3-trimethyl-2-norbornyl or 8-ethyl-8-tricyclo $[5.2.1.0^{2,6}]$ decyl.

According to another aspect of a preferred embodiment of the present invention, there is provided a resist composition including (a) a photosensitive polymer represented by the following formula (2):

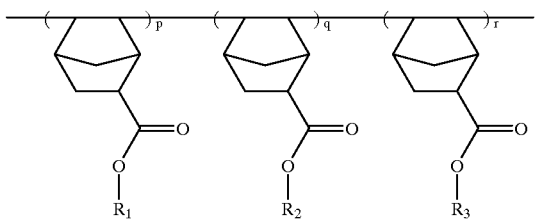

wherein $R_1$ is an acid-labile tertiary alkyl group, $R_2$ is $\gamma$-butyrolactone-2-yl, $\gamma$-butyrolactone-3-yl, pantolactone-2-yl, mevalonic lactone, 3-tetrahydrofuranyl, 2,3-propylenecarbonate-1-yl or 3-methyl-$\gamma$-butyrolactone-3-yl, $R_3$ is a hydrogen atom, methyl, ethyl or $C_3$ to $C_{20}$ alicyclic hydrocarbon group, and $p/(p+q+r)$ is 0.1~0.8, $q/(p+q+r)$ is 0.2~0.8, and $r/(p+q+r)$ is 0.0~0.4, and (b) a photoacid generator (PAG).

The PAG is preferably included in an amount of about 1 to about 15% by weight based on the total weight of the polymer.

Examples of the PAG include triarylsulfonium salts, diaryliodonium salts, sulfonates or mixtures thereof.

The resist composition further includes an organic base.

Preferably, the organic base is contained in an amount of about 0.01 to about 2.0% by weight based on the total weight of the polymer.

Examples of the organic base include triethylamine, triisobutylamine, triisooctylamine, diethanolamine, triethanolamine or a mixture thereof.

Also, according to another aspect of a preferred embodiment of the present invention, there is provided a resist composition including (a) a polymer blend prepared by mixing at least two photosensitive polymers represented by formula (1), and (b) a photoacid generator (PAG).

According to still another aspect of a preferred embodiment of the present invention, there is provided a method of preparing a photosensitive polymer according to formula (1) above comprising the steps of reacting at least two different norbornene-type compounds having an ester group as a substituent in the presence of an initiator at a temperature of about 120 to about 150° C. without a reaction catalyst.

The photosensitive polymer according to another preferred embodiment of the present invention has a main chain consisting of only norbornene-type units and can be prepared at a high yield without using a metallic catalyst. Also, the resist composition obtained from the polymer exhibits excellent adhesion.

DESCRIPTION OF THE PREFERRED EMBODIMENTS

Priority Korean Patent Application Serial No. 99-55836, filed Dec. 8, 1999, is incorporated herein in its entirety by reference.

A photosensitive polymer according to the present invention is represented by the following formula (1):

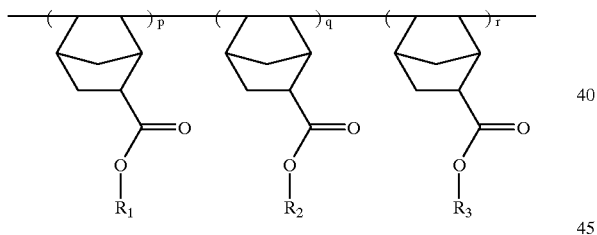

wherein $R_1$ is an acid-labile tertiary alkyl group which can be deprotected from the main chain of the polymer by the action of acid generated during exposure. For example, $R_1$ is t-butyl or a substituted or unsubstituted $C_7$ to $C_{20}$ hydocarbon group, more particularly an alicyclic hydrocarbon group, such 2-methyl-2-adamantyl, 1,2,3,3-tetramethyl-2-norbornyl, 2-methyl-2-decyl, 2,3,3-trimethyl-2-norbornyl or 8-ethyl-8-tricyclo[5.2.1.0$^{2,6}$]decyl group.

Examples of $R_2$ include γ-butyrolactone-2-yl, γ-butyrolactone-3-yl, pantolactone-2-yl, mevalonic lactone, 3-tetrahydrofuranyl, 2,3-propylenecarbonate-1-yl or 3-methyl-γ-butyrolactone-3-yl.

Examples of $R_3$ include a hydrogen atom, methyl, ethyl or $C_3$ to $C_{20}$ alicyclic hydrocarbon.

Also, in Formula (1), p/(p+q+r) is 0.1~0.8, q/(p+q+r) is 0.2~0.8, and r/(p+q+r) is 0.0~0.4.

The above photosensitive copolymers cannot be synthesized by conventional radical polymerization or addition polymerization using a metallic catalyst. Even though polymerization is achieved by the conventional method, the molecular weight of the obtained polymer is very low, that is, about several hundreds, and the yield is very low.

Polymerization methods of a photosensitive polymer according to preferred embodiments of the present invention will now be described in detail.

EXAMPLE 1

SYNTHESIS OF COPOLYMER

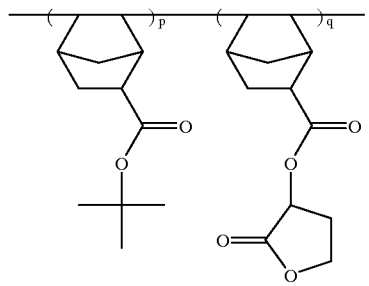

194.27 g (1 mol) of t-butyl norbornene carboxylate and 222.24 g (1 mol) of γ-butyrolactone-2-yl norbornene carboxylate were put into a three-necked round-bottom flask, 500 ml of propylene glycol monomethyl ether acetate (PGMEA) was added thereto to be completely dissolved, and then 73.115 g (0.5 mol) of di-t-butyl peroxide was added thereto. Then, the reactant was degassed for about 2 hours and then purged using nitrogen gas.

The reactant solution was stirred and polymerized at a temperature of about 130° C. for about 24 hours. Thereafter, the product was precipitated in n-hexane. The precipitate was dissolved again in tetrahydrofuran (THF) and precipitated in n-hexane. Here, instead of n-hexane, petroleum ether can be used. Thereafter, the precipitate was dried under reduced pressure, to then separate a desired product (yield: 60%).

EXAMPLE 2

Synthesis of Copolymer

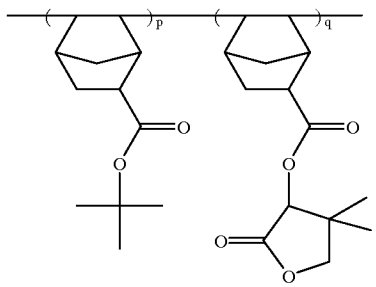

194.27 g (1 mol) of t-butyl norbornene carboxylate and 250.29 g (1 mol) of pantolactone-2-yl norbornene carboxylate were put into a three-necked round-bottom flask, 500 ml of PGMEA was added thereto to be completely dissolved, and then 14.6 g (0.1 mol) of di-t-butyl peroxide was added thereto. Then, the reactant was degassed for about 2 hours and then purged using nitrogen gas.

The reactant solution was stirred and polymerized at a temperature of about 130° C. for about 30 hours. Thereafter, the product was precipitated in n-hexane. The precipitate was dissolved again in THF and precipitated in n-hexane.

Here, instead of n-hexane, petroleum ether can be used. Thereafter, the precipitate was dried under reduced pressure, to then separate a desired product (yield: 50%).

EXAMPLE 3

SYNTHESIS OF COPOLYMER

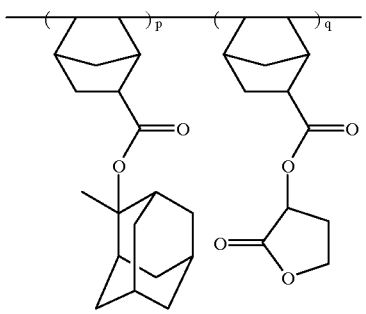

286.41 g (1 mol) of 2-methyl-2-adamantyl norbornene carboxylate and 222.24 g (1 mol) of γ-butyrolactone-2-yl norbornene carboxylate were put into a three-necked round-bottom flask, 400 ml of PGMEA was added thereto to be completely dissolved, and then 146.23 g (1 mol) of di-t-butyl peroxide was added thereto. Then, the reactant was degassed for about 2 hours and then purged using nitrogen gas.

The reactant solution was stirred and polymerized at a temperature of about 130° C. for about 20 hours. Thereafter, the product was precipitated in n-hexane. The precipitate was dissolved again in THF and precipitated in n-hexane. Here, instead of n-hexane, petroleum ether can be used. Thereafter, the precipitate was dried under reduced pressure, to then separate a desired product (yield: 45%).

EXAMPLE 4

Synthesis of Copolymer

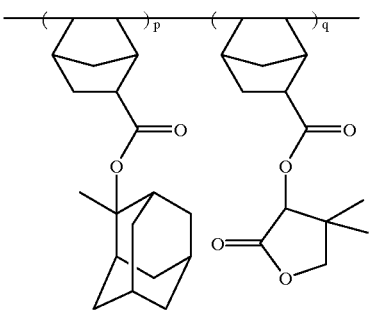

286.41 g (1 mol) of 2-methyl-2-adamantyl norbornene carboxylate and 250.29 g (1 mol) of pantolactone-2-yl norbornene carboxylate were put into a three-necked round-bottom flask, 500 ml of PGMEA was added thereto to be completely dissolved, and then 146.23 g (1 mol) of di-t-butyl peroxide was added thereto. Then, the reactant was degassed for about 2 hours and then purged using nitrogen gas.

The reactant solution was stirred and polymerized at a temperature of about 130° C. for about 30 hours. Thereafter, the product was precipitated in n-hexane. The precipitate was dissolved again in THF and precipitated in n-hexane. Here, instead of n-hexane, petroleum ether can be used. Thereafter, the precipitate was dried under reduced pressure, to then separate a desired product (yield: 50%).

EXAMPLE 5

Synthesis of Copolymer

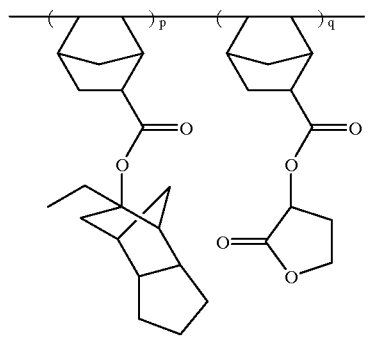

286.41 g (1 mol) of 8-ethyl-8-tricyclo[$5.2.1.0^{2,6}$]decyl norbornene carboxylate and 222.24 g (1 mol) of γ-butyrolactone-2-yl norbornene carboxylate were put into a three-necked round-bottom flask, 400 ml of PGMEA was added thereto to be completely dissolved, and then 146.23 g (1 mol) of di-t-butyl peroxide was added thereto. Then, the reactant was degassed for about 2 hours and then purged using nitrogen gas.

The reactant solution was stirred and polymerized at a temperature of about 130° C. for about 20 hours. Thereafter, the product was precipitated in n-hexane. The precipitate was dissolved again in THF and precipitated in n-hexane. Here, instead of n-hexane, petroleum ether can be used. Thereafter, the precipitate was dried under reduced pressure, to then separate a desired product (yield: 45%).

EXAMPLE 6

Synthesis of Copolymer

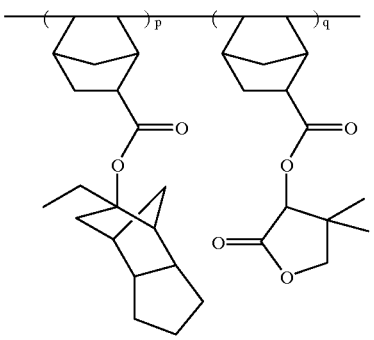

286.41 g (1 mol) of 8-ethyl-8-tricyclo[$5.2.1.0^{2,6}$]decyl norbornene carboxylate and 250.29 g (1 mol) of pantolactone-2-yl norbornene carboxylate were put into a three-necked round-bottom flask, 500 ml of PGMEA was added thereto to be completely dissolved, and then 146.23 g (1 mol) of di-t-butyl peroxide was added thereto. Then, the reactant was degassed for about 2 hours and then purged using nitrogen gas.

The reactant solution was stirred and polymerized at a temperature of about 130° C. for about 30 hours. Thereafter, the product was precipitated in n-hexane. The precipitate was dissolved again in THF and precipitated in n-hexane. Here, instead of n-hexane, petroleum ether can be used. Thereafter, the precipitate was dried under reduced pressure, to then separate a desired product (yield: 50%).

EXAMPLE 7

Synthesis of Terpolymer

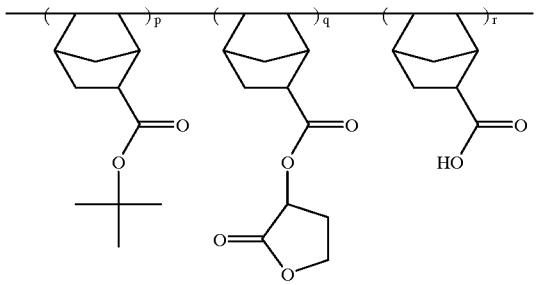

194.27 9 (1 mol) of t-butyl norbornene carboxylate, 200 g (0.9 mol) of γ-butyrolactone-2-yl norbornene carboxylate and 13.82 g (0.1 mol) of 5-norbornene-2-carboxylic acid were put into a three-necked round-bottom flask, 500 ml of PGMEA was added thereto to be completely dissolved, and then 73.115 g (0.5 mol) of di-t-butyl peroxide was added thereto. Then, the reactant was degassed for about 2 hours and then purged using nitrogen gas.

The reactant solution was stirred and polymerized at a temperature of about 130° C. for about 24 hours. Thereafter, the product was precipitated in n-hexane. The precipitate was dissolved again in THF and precipitated in n-hexane. Here, instead of n-hexane, petroleum ether can be used. Thereafter, the precipitate was dried under reduced pressure, to then separate a desired product (yield: 60%).

EXAMPLE 8

Synthesis of Copolymer

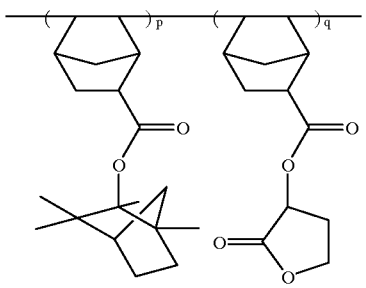

288.43 g (1 mol) of a compound represented by the following formula and 333.36 g (1.5 mol) of γ-butyrolactone-2-yl norbornene carboxylate were put into a three-necked round-bottom flask, and 1 l of PGMEA was added thereto to be completely dissolved.

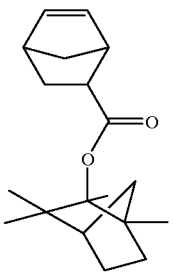

Thereafter, 14.6 g (0.1 mol) of di-t-butyl peroxide was added to the resultant product, which was degassed for about 2 hours and then purged using nitrogen gas. The reactant solution was stirred and polymerized at a temperature of about 140° C. for about 24 hours. Thereafter, the product was precipitated in n-hexane. The precipitate was dissolved again in THF and precipitated in n-hexane. Here, instead of n-hexane, petroleum ether can be used. Thereafter, the precipitate was dried under reduced pressure, to then separate a desired product (yield: 50%).

EXAMPLE 9

Synthesis of Copolymer

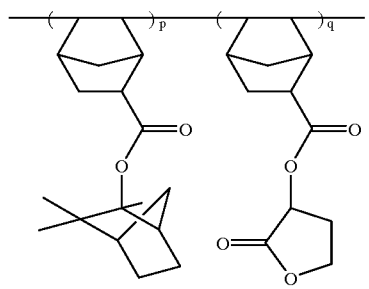

274.40 g (1 mol) of a compound represented by the following formula and 333.36 g (1.5 mol) of γ-butyrolatone-2-yl norrbornene carboxylate were put into a three-necked round-bottom flask, and 1 l of PGMEA was added thereto to be completely dissolved.

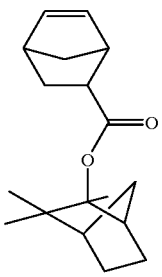

Thereafter, 29.2 g (0.2 mol) of di-t-butyl peroxide was added to the resultant product, which was degassed for about 2 hours and then purged using nitrogen gas.

The reactant solution was stirred and polymerized at a temperature of about 140° C. for about 24 hours. Thereafter, the product was precipitated in n-hexane. The precipitate was dissolved again in THF and precipitated in n-hexane.

Here, instead of n-hexane, peyroleum ether can be used. Thereafter, the precipitate was dried under reduced pressure, to then separate a desired product (yield: 50%).

EXAMPLE 10

Synthesis of Copolymer

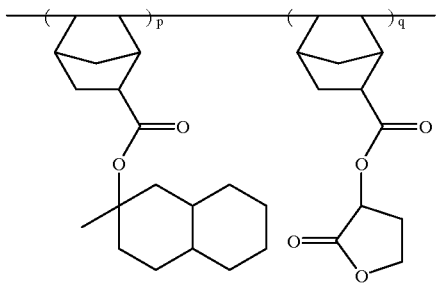

288.43 g (1 mol) of a compound represented by the following formula and 333.36 g (1.5 mol) of γ-butyrolactone-2-yl norbornene carboxylate were put into a three-necked round-bottom flask, and 1 l of PGMEA was added thereto to be completely dissolved.

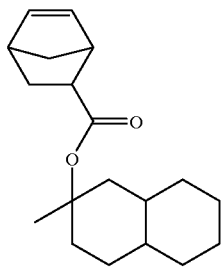

Thereafter, 29.2 g (0.2 mol) of di-t-butyl peroxide was added to the resultant product, which was degassed for about 2 hours and then purged using nitrogen gas.

The reactant solution was stirred and polymerized at a temperature of about 140° C. for about 24 hours. Thereafter, the product was precipitated in n-hexane. The precipitate was dissolved again in THF and precipitated in n-hexane. Here, instead of n-hexane, petroleum ether can be used. Thereafter, the precipitate was dried under reduced pressure, to then separate a desired product (yield: 50%).

EXAMPLE 11

Patterning Process Using Resist Composition 1.0 g of a polymer selected from polymers synthesized in Examples 1 through 10, and 1 to 15% by weight of a photoacid generator (based on the total weight of the polymer) were dissolved in 7.0 g of PGMEA. Then, if necessary, 0.01 to 2.0% by weight of an organic base comprised of an amine (based on the total weight of the polymer) was added thereto to completely dissolve the reactants.

Examples of the PAG include triarylsulfonium salts, diaryliodonium salts and sulfonates, or a mixture of at least two of these materials.

Examples of the organic base include triethylamines, truisobutylamines, triisooctylamines, diethanolamines, triethanolamines, or a mixture of at least two of these materials.

Thereafter, the solution was filtered using a 0.2 µm membrane filter to obtain a resist composition.

Then, for a patterning process using the resist composition obtained by the above method, the following processes were used.

A silicon wafer having a silicon oxide film formed thereon was prepared and treated with hexamethyldisilazane (HMDS). Then, the resist composition was coated on the silicon oxide film to a thickness of about 0.4 µm.

The wafer having the resist composition coated thereon was pre-baked at a temperature of 140° C. for 90 seconds and exposed to light using an ArF excimer laser having a numerical aperture of 0.6. Then, post exposure baking (PEB) was performed at a temperature of 110 to 140° C. for 90 seconds.

Thereafter, the resultant was developed using 2.38 wt % of tetramethylammonium hydroxide (TMAH) solution for about 60 seconds.

The respective polymers synthesized in Examples 1 through 10 were mixed with the above-stated PAGs and organic bases in various manners to form resist patterns. As a result, when exposure doses were 3 to 26 mJ/cm², it was observed that a 0.13 to 0.26 µm line and space pattern was obtained As described above, according to the present invention, by providing a polymer whose main chain consists of only norbornene-type units, which are alicyclic compounds, in order to overcome the drawback of a conventional ArF resist, sufficiently increased dry etching resistance can be obtained.

Also, in the present invention, since the adhesion characteristic of a polymer is enhanced, excellent adhesion to underlying layers is exhibited and it is possible to attain development using general developing solutions. Thus, excellent lithographic performance can be obtained using the resist composition obtained from the polymer, and the resist composition according to the present invention can be useful in the manufacture of next generation semiconductor devices.

Also, according to the present invention, a polymer having a main chain consisting of only norbornene-type units can be prepared without using a metal catalyst.

Although the present invention has been described in detail through preferred embodiments, the invention is not limited thereto, and various modifications and alterations within the spirit and scope of the invention are possible by those skilled in the art.

What is claimed is:

1. A photosensitive polymer represented by the following formula (1):

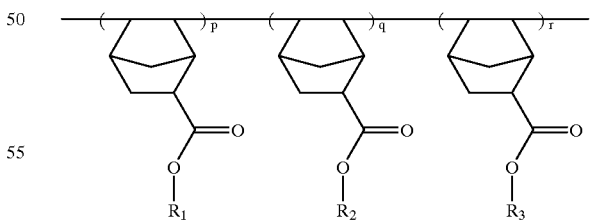

wherein $R_1$ is an acid-labile tertiary alkyl group, $R_2$ is γ-butyrolactone-2-yl, γ-butyrolactone-3-yl, pantolactone-2-yl, mevalonic lactone, 3-tetrahydrofuranyl, 2,3-propylenecarbonate-1-yl or 3-methyl-γ-butyrolactone-3-yl, $R_3$ is a hydrogen atom, methyl, ethyl or $C_3$ to $C_{20}$ alicyclic hydrocarbon group, and p/(p+q+r) is 0.1~0.8, q/(p+q+r) is 0.2~0.8, and r/(p+q+r) is 0.0~0.4.

2. The photosensitive polymer according to claim 1, wherein the photosensitive polymer has a weight-average molecular weight of 3,000~100,000.

3. The photosensitive polymer according to claim 1, wherein $R_1$ is t-butyl or 2-methyl-2-decyl.

4. The photosensitive polymer according to claim 1, wherein $R_1$ is a substituted or unsubstituted $C_7$ to $C_{20}$ alicyclic hydrocarbon group.

5. The photosensitive polymer according to claim 4, wherein $R_1$ is 2-methyl-2-adamantyl, 1,2,3,3-tetramethyl-2-norbornyl, 2,3,3-trimethyl-2-norbornyl, 8-ethyl-8-tricyclo [5.2.1.0$^{2,6}$]decyl or 1-methylbicyclo[4.4.0]decyl.

6. The photosensitive polymer according to claim 1, wherein $R_1$ is t-butyl, $R_2$ is γ-butyrolactone-2-yl or γ-butyrolactone-3-yl, and $R_3$ is a hydrogen atom.

7. The photosensitive polymer according to claim 1, wherein $R_1$ is t-butyl, $R_2$ is mevalonic lactone, and $R_3$ is a hydrogen atom.

8. The photosensitive polymer according to claim 1, wherein $R_1$ is 2-methyl-2-adamantyl, $R_2$ is γ-butyrolactone-2-yl or γ-butyrolactone-3-yl and $R_3$ is a hydrogen atom.

9. A resist composition comprising:
(a) a photosensitive polymer represented by the following formula:

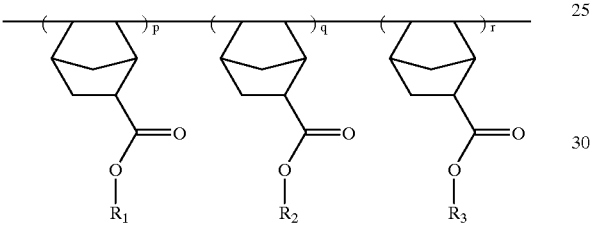

wherein $R_1$ is an acid-labile tertiary alkyl group, $R_2$ is γ-butyrolactone-2-yl, γ-butyrolactone-3-yl, pantolactone-2-yl, mevalonic lactone, 3-tetrahydrofuranyl, 2,3-propylenecarbonate-1-yl or 3-methyl-γ-butyrolactone-3-yl, $R_3$ is a hydrogen atom, methyl, ethyl or $C_3$ to $C_{20}$ alicyclic hydrocarbon, and p/(p+q+r) is 0.1~0.8, q/(p+q+r) is 0.2~0.8, and r/(p+q+r) is 0.0~0.4; and
(b) a photoacid generator (PAG).

10. The resist composition according to claim 9, wherein the photosensitive polymer has a weight-average molecular weight of 3,000~100,000.

11. The resist composition according to claim 9, wherein $R_1$ is t-butyl or 2-methyl-2-decyl.

12. The resist composition according to claim 9, wherein $R_1$ is a substituted or unsubstituted $C_7$ to $C_{20}$ alicyclic hydrocarbon group.

13. The resist composition according to claim 12, wherein $R_1$ is 2-methyl-2-adamantyl, 1,2,3,3-tetramethyl-2-norbornyl, 2,3,3-trimethyl-2-norbornyl, 8-ethyl-8-tricyclo [5.2.1.0$^{2,6}$]decyl or 1-methylbicyclo[4.4.0]decyl.

14. The resist composition according to claim 9, wherein $R_1$ is t-butyl, $R_2$ is γ-butyrolactone-2-yl or γ-butyrolactone-3-yl, and $R_3$ is a hydrogen atom.

15. The resist composition according to claim 9, wherein $R_1$ is t-butyl, $R_2$ is mevalonic lactone, and $R_3$ is a hydrogen atom.

16. The resist composition according to claim 9, wherein $R_1$ is 2-methyl-2-adamantyl, $R_2$ is γ-butyrolactone-2-yl or γ-butyrolactone-3-yl and $R_3$ is a hydrogen atom.

17. The resist composition according to claim 9, wherein the PAG is included in an amount of about 1 to 15% by weight based on the total weight of the polymer.

18. The resist composition according to claim 9, wherein the PAG is selected from the group consisting of triarylsulfonium salts, diaryliodonium salts, sulfonates and mixtures thereof.

19. The resist composition according to claim 9, further comprising an organic base.

20. The resist composition according to claim 19, wherein the organic base is contained in an amount of about 0.01 to about 2.0% by weight based on the total weight of the polymer.

21. The resist composition according to claim 19, wherein the organic base is selected from the group consisting of triethylamine, triisobutylamine, triisooctylamine, diethanolamine, triethanolamine and mixtures thereof.

22. A resist composition comprising:
(a) a polymer blend prepared by mixing at least two photosensitive polymers selected from the group consisting of photosensitive polymers represented by the formula (1):

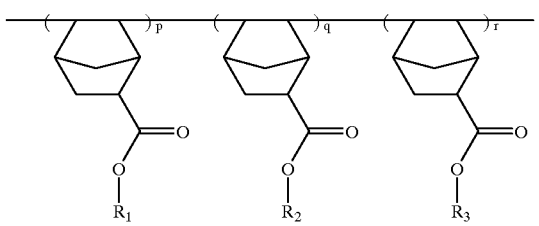

wherein $R_1$ is an acid-labile tertiary alkyl group, $R_2$ is γ-butyrolactone-2-yl, γ-butyrolactone-3-yl, pantolactone-2-yl, mevalonic lactone, 3-tetrahydrofuranyl, 2,3-propylenecarbonate-1-yl or 3-methyl-γ-butyrolactone-3-yl, $R_3$ is a hydrogen atom, methyl, ethyl or $C_3$ to $C_{20}$ alicyclic hydrocarbon group, and p/(p+q+r) is 0.1~0.8, q/(p+q+r) is 0.2~0.8, and r/(p+q+r) is 0.0~0.4., and
(b) a photoacid generator (PAG).

23. Method of preparing a photosensitive polymer having a main chain including only norbornene groups, the method comprising the step of reacting at least two different ester-substituted norbornenes in the presence of an initiator at a temperature of about 120 to about 150° C. without a reaction catalyst.

24. The method of claim 23 wherein the photosensitive polymer is represented by the following formula (1):

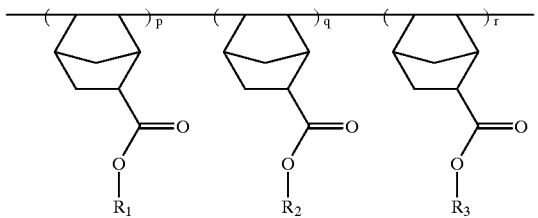

wherein $R_1$ is an acid-labile tertiary alkyl group, $R_2$ is γ-butyrolactone-2-yl, γ-butyrolactone-3-yl, pantolactone-2-yl, mevalonic lactone, 3-tetrahydrofuranyl, 2,3-propylenecarbonate-1-yl or 3-methyl-γ-butyrolactone-3-yl, $R_3$ is a hydrogen atom, methyl, ethyl or $C_3$ to $C_{20}$ alicyclic hydrocarbon group, and p/(p+q+r) is 0.1~0.8, q/(p+q+r) is 0.2~0.8, and r/(p+q+r) is 0.0~0.4.

25. The method according to claim 23, wherein the initiator is di-t-butyl peroxide.

* * * * *